United States Patent [19]

Ingle et al.

[11] Patent Number: 5,379,512
[45] Date of Patent: Jan. 10, 1995

[54] METHOD FOR BONDING A FLEXIBLE CABLE TO AN ELECTRICAL COMPONENT

[75] Inventors: Lloyd D. Ingle, Lompoc; Leonard E. Peck, Jr.; Jose A. Santana, both of Goleta, all of Calif.

[73] Assignee: Santa Barbara Research Center, Goleta, Calif.

[21] Appl. No.: 970,900

[22] Filed: Nov. 3, 1992

Related U.S. Application Data

[62] Division of Ser. No. 394,049, Aug. 14, 1989, Pat. No. 5,183,973.

[51] Int. Cl.6 ............................................. H05K 3/30
[52] U.S. Cl. ........................................ 29/832; 29/843; 228/54
[58] Field of Search ................. 228/179, 54; 29/843, 29/832

[56] References Cited

U.S. PATENT DOCUMENTS 3,224,072 12/1965 Summers et al. ............... 29/843 X
4,776,509 10/1988 Pitts et al. ............................ 228/179

FOREIGN PATENT DOCUMENTS 54-114790 9/1979 Japan ..................................... 29/843

Primary Examiner—Carl J. Arbes
Attorney, Agent, or Firm—W. C. Schubert; W. K. Denson-Low

[57] ABSTRACT

A method for bonding the ends of the conductors 52 to circuit pads 54 is disclosed whereby the cable 20 is placed over the circuit pads 54; a bonding tool 44 is pressed against an upper surface 58 of the cable 20; the substrate 46 of the cable 20 is compressed beyond its elastic limit; and ultrasonic energy is applied to the bonding tool 44 and transmitted through the substrate 46 to effect a metallic bond between the conductors 52 and circuit pads 54.

10 Claims, 2 Drawing Sheets

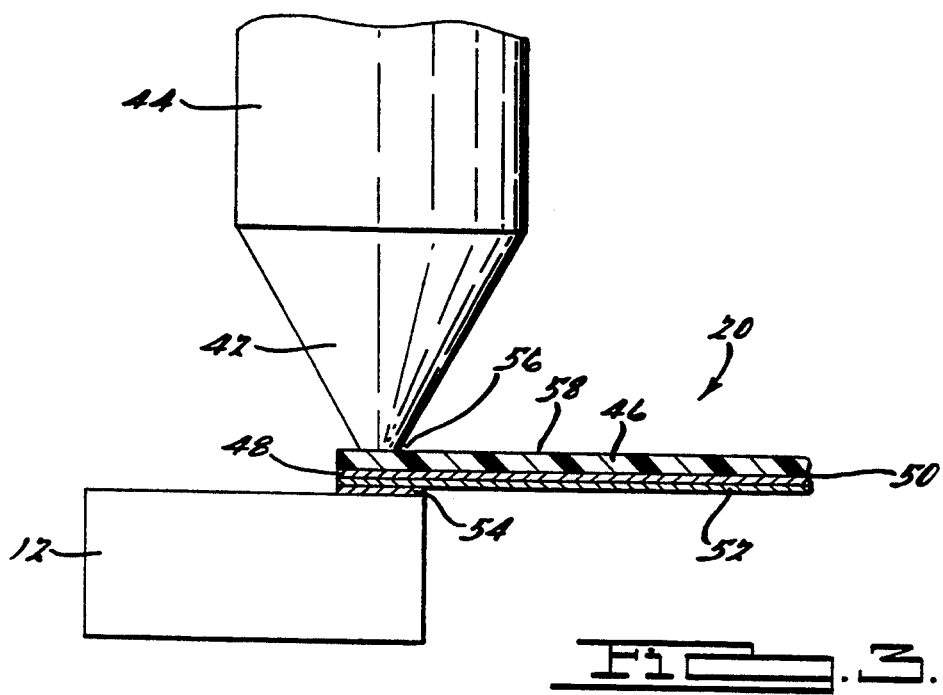
FIG. 3.
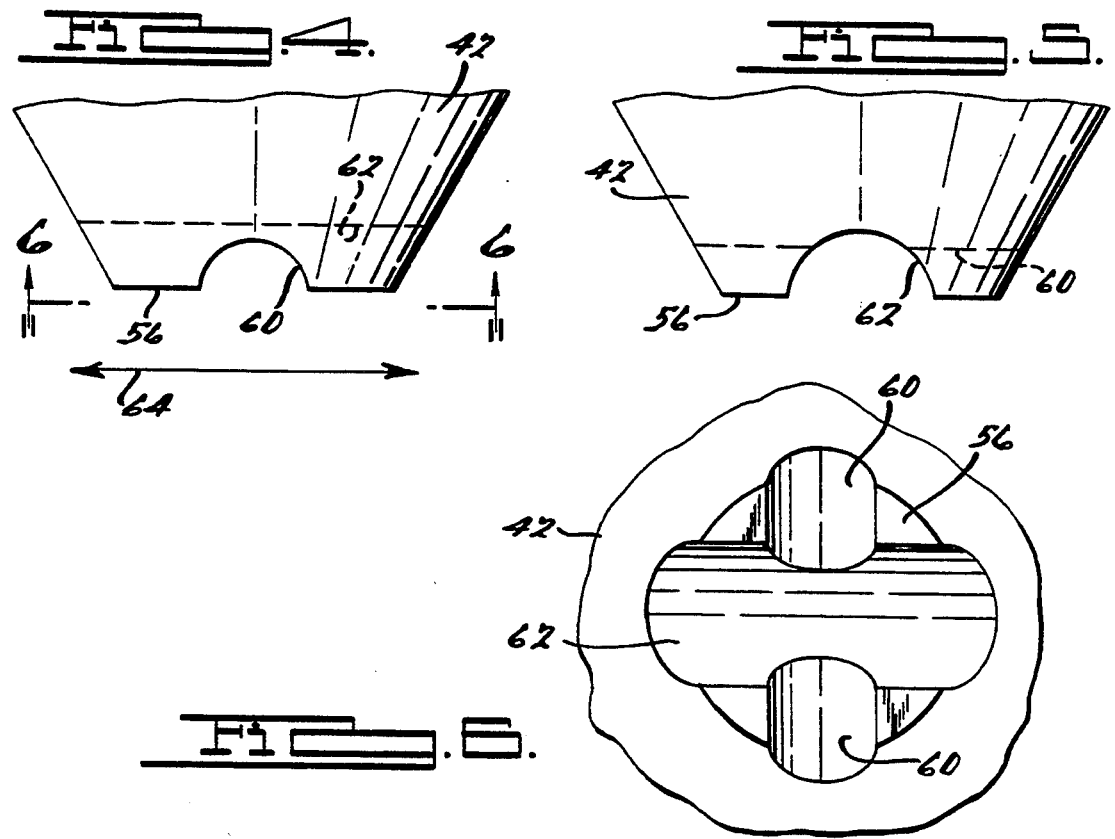
FIG. 4. FIG. 5.
FIG. 6.

METHOD FOR BONDING A FLEXIBLE CABLE TO AN ELECTRICAL COMPONENT

This is a division of application Ser. No. 394,049, filed Aug. 14, 1989, now U.S. Pat. No. 5,183,973, issued Feb. 2, 1993.

BACKGROUND OF THE INVENTION

1. Technical Field

This invention relates to an apparatus for interconnecting the detector assembly of an infrared system to the processor electronics of the system, and to a method for connecting the apparatus to the circuit pads of an infrared detector. More generally, the invention relates to an apparatus for interconnecting electronic components.

2. Discussion

A significant number of infrared detector/dewar applications require operation at cryogenic temperatures ($<135°$ K). In order to minimize the thermal loads on the cooling devices of such systems, the detector assembly is typically packaged within a vacuum and mounted directly onto the coldfinger within a dewar. A thin film flexible cable is then used to electrically interconnect the cooled detector assembly with an ambient temperature input/output connector, thereby providing means for electrically connecting the cooled detector with external, ambient temperature processor electronics. Because the cable acts as a thermal short between the coldfinger and the ambient environment, thermal performance is the primary consideration in the design of the cable.

The two thermal characteristics of a cable that most heavily affect its thermal performance are the thermal conductance and $I^2R$ heating of the conductors of the cable. Of these two, thermal conductance is usually the most critical. To minimize thermal conductance the conductor material is selected based on its electrical and thermal conductivity properties. Typical conductor materials like gold and copper exhibit the optimum electrical conductivity characteristics; however, the small cross-sectional area of the conductor, which is necessary so as not to exceed the thermal conductance requirements, is far below industry processing limits. Consequently, constantan, nickel or stainless steel have become the metal-foils of choice because of their low thermal conductivity properties. But even with these metals, the conductor lengths required to achieve a sufficiently large thermal resistance are many times longer than that required to interconnect the detector assembly and the input/output connector.

It would be desirable to have a thin film cable whose conductors are made of gold. Such a cable would provide optimum thermal performance in connecting the cooled detector assembly of an infrared array with the ambient temperature input/output connector of the dewar.

An additional problem has been inadequate bond or adhesive strength between the metal-foil conductors and the dielectric substrates adhered to each side of the conductors. This problem has been particularly, acute with respect to thin film cables used to connect to an infrared detector assembly, operating at cryogenic temperatures.

Other disadvantages exist. Prior art metal-foil conductors, being laminated to dielectric substrates on each side of the metal-foil, generally require the use of material that can contaminate the dewar environment resulting in reduced vacuum life and lengthy pump-down times. Metal-foil cables also require complex multi-operation manufacturing processes that are low yield and result in a high unit cost. In addition, laminated cables are not very flexible and continued working or bending of them during the assembly process often results in separation of the foil and dielectrics. Moreover, the non-flexible nature of laminated metal-foil cables typically requires that each end of the cable be attached to a part of the dewar structure to provide a strain relief for the fine wire interconnections and to protect them from damage during thermocycling of the dewar. It would therefore be advantageous to have a thin film cable of simple construction that avoids the use of adhesives and the like in the manufacturing process, which is more flexible than a laminated metal-foil cable without its conductive elements being prone to separation from its substrate material, and which operates reliably in a cryogenic environment.

There are two major prior art methods of connecting thin film cables to the circuit pads of infrared detectors and other electronic components. The first consists of attaching a metal-foil cable to a part of a mounting structure at each end of the cable with adhesives or mechanical clamps and interconnecting the cable to the circuit pads of a detector or other electronic component by wirebonding fine wire to the circuit pads and the conductors of the cable. The second uses a direct fine wire connection from a circuit pad to a second connection point.

A problem exists in both prior art methods in that completion of the interconnection is dependent on fine wire interconnections achieved by wire bonding. These wirebonds are frail, easily broken, and require two joints in a circuit line (one at either end of the wire).

A third prior art method of connection, Tape Automated Bonding (TAB), eliminates the need for wirebonding by direct bonding of the conductor to the circuit pads of the detector or other electronic device. However, with TAB, substrate material is usually removed around the conductor by toxic agents or the like so that a bonding tool can make actual contact with the conductor material. This extra step is costly and inconvenient.

It would therefore also be desirable to have a method of connecting a thin, film cable to the connector pads of an infrared detector or other electronic device that eliminates the need for the fine wire connections associated with wirebonding or the need to remove a portion of the substrate material required by the TAB connection method.

SUMMARY OF THE INVENTION

The present invention overcomes the limitations associated with prior art cables and bonding methods by providing a unique thin film cable and a unique method for attaching the cable to circuit pads of an infrared detector or any other electronic device having circuit pads.

The thin film cable comprises a substantially flat, thin insulative substrate having an upper and a lower side; a layer of nonorganic adhesive material adhered to the lower side of the substrate; and a plurality of gold conductors adhered on the adhesive material.

The thin film cable is attached by placing it over a plurality of connection points so that the ends of the conductors lie on the connection points; pressing the upper side of the substrate over ends of the conductors with an ultrasonic bonding tool having a pair of orthogonal grooves of unequal size in its tip; and applying ultrasonic energy to the tool and through the substrate while applying downward pressure for a sufficient period of time to bond the conductors to the connection points.

BRIEF DESCRIPTION OF THE DRAWINGS

The various advantages of the present Invention will become apparent to one skilled in the art by reading the following specification and by referencing the following drawings in which:

FIG. 3 is an illustration of a bonding tool in position to bond a first end of the thin film cable to the circuit pads of the infrared detector;

FIG. 4 is an enlarged side view of the tip of the bonding tool;

FIG. 5 is an enlarged side view of the tip of the bonding tool similar to FIG. 4 except that the tip has been rotated 90°; and FIG. 6 is a sectional view taken along the lines 6—6 of FIG. 4 showing more fully the geometric relationship between the two grooves in the tip of the bonding tool.

DESCRIPTION OF THE PREFERRED EMBODIMENTS

Figure 1:
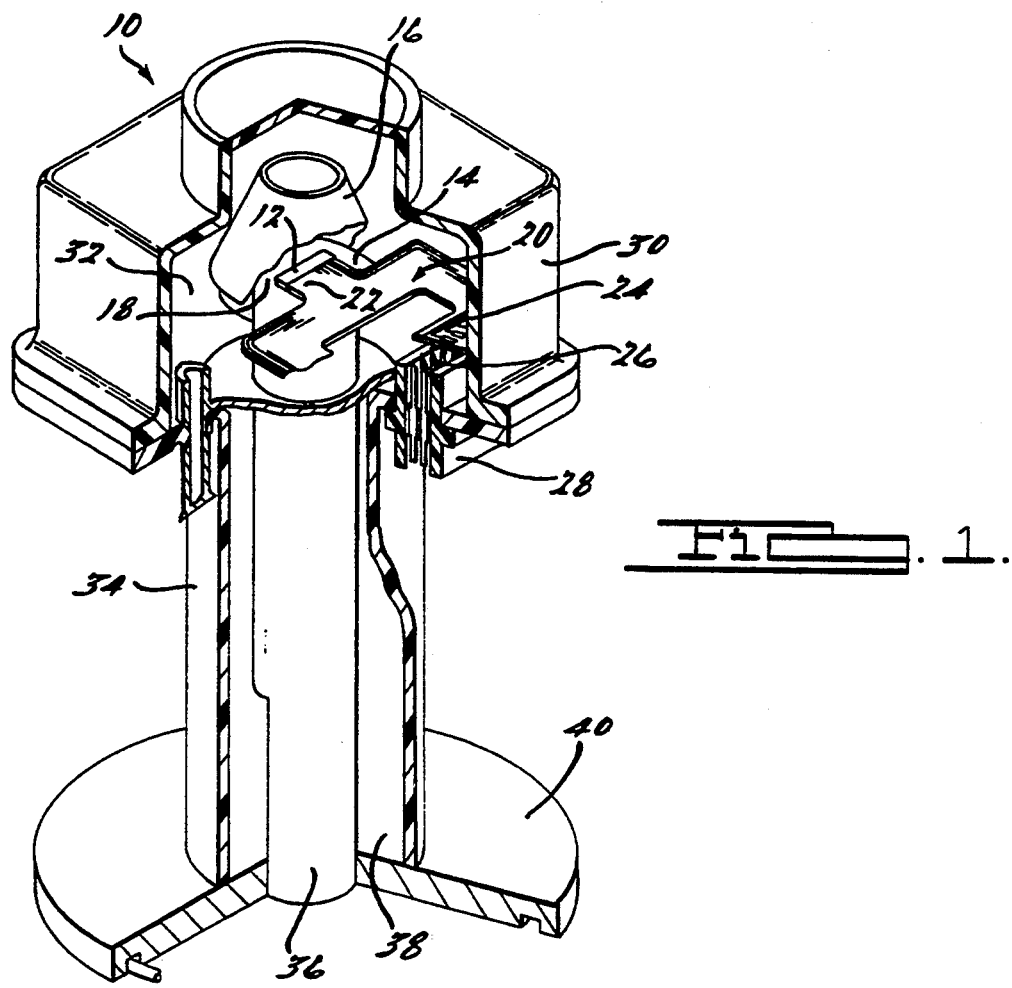
FIG. 1 is a fragmentary perspective view of an overall infrared detector/dewar system using the flexible thin film cable of the present invention.

Referring to FIG. 1 there is illustrated an overall infrared detector/dewar system 10 in which the present invention may be used. An infrared detector 12 is disposed on an interior base portion 14 of a coldshield 16 defining an Interior area 18 which is cooled down to cryogenic temperatures. The flexible cable 20 is shown having a first end 22 electrically connected to the detector 12 and a second end 24 connected to pins 26 of a hermetically sealed Input/output connector 28. The pins 26 run vertically through the connector 28 and provide a means for electrically connecting the thin film cable 20 with external processor electronics (not shown).

A vacuum housing 30 is further shown for maintaining a vacuum in area 32 at an ambient temperature. The system 10 further includes a tubular portion 34 having an apertured coldfinger portion 36 therethrough, a getter 38 for removing moisture and residual gasses from the internal confines of the system 10, and a mounting flange 40 attached to the tubular portion 34.

Figure 2:
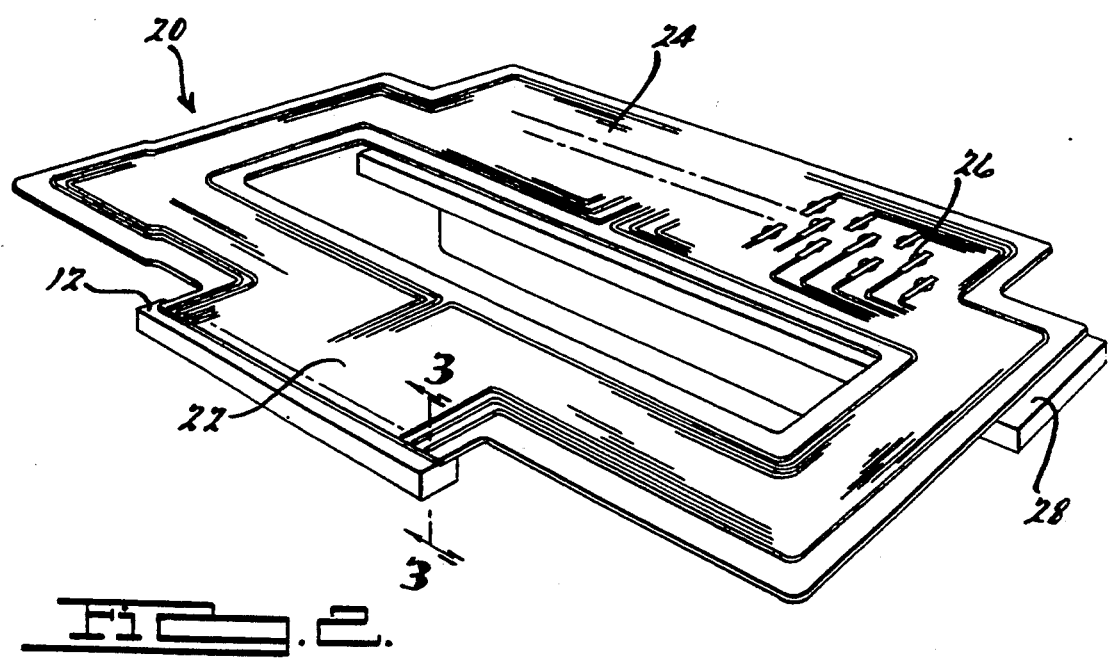
FIG. 2 is a perspective view of a typically shaped thin film cable according to the present invention bonded to the circuit pads of an infrared detector and the pins of an input/output connector.

In FIG. 2 an enlarged perspective view of a preferred embodiment of the thin film cable 20 is shown. As can be seen more clearly, the first end 22 of the thin film cable 20 Is placed in contact over a portion of the detector 12. The second end 24 is placed in contact with the connector pins 26 of the input/output connector 28. In practice, the thin film cable 20 may be configured in any desired shape that provides the desired thermal and electrical characteristics for a specific application. In FIG. 2, however, a rectangularly-shaped structure for the thin film cable 20 is shown. A rectangular-shape is preferable when the thin film cable 20 is used in dewar applications, as such a shape helps to provide the desired thermal and electrical characteristics for matching the cooled detector with the external, ambient temperature processor electronics, while fitting properly within the confines of the vacuum housing 30 shown in FIG. 1. It should be appreciated, however, that while the thin film cable 20 is particularly well-suited to Infrared detector/dewar applications, its ability to provide specific thermal and electrical loading characteristics will make it valuable in a wide variety of electronic applications.

In FIG. 3 there is an enlarged view further illustrating the substrate 46 or the thin film cable 20 In contact with a conically-shaped tip 42 of an ultrasonic bonding tool 44. The substrate 46 of the thin film cable 20 is a thin polyimide film having a thickness in the range of 0.0003 to 0.020 inches, preferably between 0.0005 to 0.0030 inches, and more preferably 0.001 inches. It is presently preferred to use polyimide-H film, although other types of film may be suitable.

The substrate 46 further has a layer of titanium 48, preferably in the range of 400 to about 2,000 angstroms thick, sputtered uniformly onto its underside 50 for strengthening the bond of a plurality of conductors 52 (of which only one is visible In FIG. 3) to the underside of the thin film cable 20. Although titanium Is the preferred material for strengthening the bond of the conductors, other nonorganic metallic materials such as tungsten or molybdenum followed by chromium, such as is used in semiconductor fabrication may also be used.

Prior to sputtering the layer of titanium 48 onto the polyimide film 46, the film 48 is first secured by stretching it radially over a ring and fastening it thereto in a manner similar to the operation of embroidery hoops. It is presently preferred to use such rings having diameters between three and four inches. The polyimide film 46 is then cleaned with methanol to remove oils. Thereafter, oxygen plasma cleaning is used, and the surface of the polyimide film 46 is then limited to exposure to the atmosphere and the moving charges therein to the extent possible. Prior to the deposition of a layer of titanium 48 by sputtering, the polyimide film 48 is reverse sputtered or etched in a vacuum deposition chamber using argon in order to remove oxides and to allow the adhesion of metal films to the polyimide film 46. Presently, it is preferred to remove approximately 10 to 20 angstroms of material from the surface of the polyimide film. This can be done using a thin film sputtering system sold by Material Research Corporation operating at a pressure of approximately 3.5 millitorrs at 400 volts for ten minutes. Thereafter, the polyimide film is exposed under a titanium target in a sputtering system using argon ions at a pressure of 7 millitorrs and a voltage of 2 kilovolts for ten minutes. While a thickness of approximately 1,500 angstroms for the layer of titanium 48 is presently preferred using this system, it should be realized that layers of other thicknesses may be used. If the titanium is too thin, it may be inadequate in view of subsequent chemical processing steps. On the other hand, differences in thermal expansions of adjacent materials and other causes may lead to failure in the case where the titanium layer is too thick. In particular, if the layer is too thick, delamination may result. It will be appreciated by those skilled in the art that the actual limits for the thickness of the titanium layer 48 will vary depending upon circumstances such as the thickness of the polyimide film 46, the ultimate electrical configuration desired and also on the particular equipment used.

For example, using a magnetron sputtering system sold by Consolidated Vacuum Corporation, it is presently preferred to have a titanium layer about 600 angstroms thick. It is presently preferred to have the thickness of the titanium layer in the range from about 400 to 2,000 angstroms.

To form the conductors 52, gold is sputtered onto the titanium layer 48. Presently, it is preferred to perform the gold sputtering in the same sputtering system as that in which the titanium layer 48 is deposited, so that the titanium layer does not become oxidized. This may be accomplished by moving the polyimide film 46 having the titanium layer 48 under a gold target and operating the Material Research Corporation system at a pressure of 5 millitorrs and at a voltage of 2.5 kilovolts. Because of the high molecular weight of gold, distortion of the polyimide film during the sputtering process is avoided by limiting the thickness of the sputtered gold conductors 52. The gold conductors 52 will preferably be sputtered to a thickness of about 1,000 to 3,000 angstroms, more preferably 1,700 angstroms. The gold conductors 52 should be sputtered to a thickness at least sufficient to prevent oxidation of the titanium layer. A layer of 500 angstroms or less may suffice in some cases, while 1,700 angstroms would usually be sufficient. Using the Consolidated Vacuum Corporation System, for example, a layer of 1,000 angstroms is presently preferred.

Additional gold may then be electroplated onto the conductors 52 to achieve a predetermined total thickness needed to meet specific electrical and thermal requirements. When connecting the thin film cable 20 to a detector operating in a cryogenic environment, these requirements will usually mandate the electroplating of additional gold onto the conductors 52 to achieve a total thickness in the range of 25,000 to 100,000 angstroms. The gold conductors 52 are then etched to a width in the neighborhood of 0.0002 to 0.0005 inches, depending again on the desired performance characteristics, to provide a distance between the centers of adjacent conductors of 0.0004 to 0.010 inches. This may be accomplished using photoresist to obtain the separate conductors 52. It is presently preferred to use a high viscosity photoresist that does not bead easily and that may be applied in a thick layer that is softly baked before exposure through a mask and subsequent removal of gold and titanium to delineate the conductors 52. Alternately, separate conductors may be delineated before the electroplating of gold onto the deposited gold occurs.

In addition, the ends of the conductors may be plated-up with additional gold to achieve the necessary thickness for the attachment bond, which will require a total thickness of approximately 50,000 angstoms to achieve a proper metal to metal bond. For simplicity, however, the conductor 52 shown in FIG. 3 is illustrated having a uniform thickness throughout its length.

The particular voltages, pressures and times used to perform the various steps in fabricating the metal adhesive and gold layers on the polyimide film will vary depending on the specific equipment utilized and the desired resultant structure. It is also to be noted that depositions may be accomplished to fabricate the cable of the present invention using thermal evaporation equipment and techniques, and that the present invention Is not therefore limited to cables produced by any particular type of equipment, such as sputtering systems.

In FIG. 3, as mentioned previously, the ultrasonic bonding tool 44 is shown in position ready to bond the conductor 52 of the thin film cable 20 to a circuit pad 54 on the detector 12. A flat surface 56 of the tip 42 of the bonding tool 44 is placed against an upper surface 58 of the polyimide substrate 46, and further positioned so that the flat surface 56 of the tip 42 of the bonding tool 44 will be disposed over the gold conductor 52 in contact with the circuit pad 54 of the detector 12.

To attach the thin film cable 20 conductor 52 to the circuit pad 54, bonding energy in the form of an applied downward force in the range of 15 grams-150 grams, and possibly up to 250 grams, for a time of between 20 ms and 500 ms, and possibly up to two seconds, is applied to the bonding tool 44 and transferred to the surface 56 of the bonding tool tip 42. The downward pressure is calculated to cause a compression of the polyimide substrate 46 beyond its elastic limit. Presently it is preferred to use a force of 65 grams for about 100 ms in order to attach a thin film cable 20 using a substrate having a thickness of 0.001 inch. The actual forces and times most advantageously used will vary depending upon a great many circumstances. For any particular thin film cable 20, it will be necessary to increase the force and/or time if no bond is achieved and to decrease the force and/or time if unacceptable damage, such as a broken conductor 52 results.

While the bonding tool tip 42 is in pressurized contact with the upper surface 58 of the substrate 46, ultrasonic energy in the form of a 50,000 KHZ to 100,000 KHZ mechanical scrubbing signal is applied to the bonding tool tip 42 during the time that downward pressure is being applied to the bonding tool 44. The ultrasonic energy is transferred through the polyimide substrate 46 to the conductor 52 and the circuit pad 54, thereby producing a metal to metal bond between the conductor 52 and the circuit pad 54. The displacement of such a scrub is preferably on the order of 0.0001 inch. By transferring the ultrasonic energy through the polyimide substrate 46, the need to remove a portion of the substrate 46, usually by toxic agents or the like, so that the bonding tool tip 42 can make actual contact with the conductor 52, as is required with Tape Automated Bonding, is eliminated. This simplifies greatly the attachment method by reducing the number of steps in the process and the costs and inconvenience associated with removing a portion of the polyimide. The necessity of using frail wirebonds to make the electrical connection with the circuit pad 54 is also eliminated, as is the need for using adhesives or the like to bond the cable to a surface near the circuit pad 54 when wirebonding is used.

The bonding energy will further include an additional subsonic scrub of a frequency of 10 HZ to 500 HZ for thicker thin film cable structures. Where necessary, the attachment area of the conductors will include a localized reduced thickness achieved by either wet or dry processing to insure effective energy transfer for the attachment bonding.

FIG. 4 is an illustration of an enlarged portion of the bonding tool tip 42 more fully showing a first semi-circular groove 60 having a radius of approximately 0.0005 inch, recessed to a depth of approximately 0.0003 inch, within the surface 56 of the bonding tool tip 42, and running longitudinally therethrough. The tip surface 56, which will have a typical diameter of 0.005 inch, will further have a second semi-circular groove, represented in FIG. 4 by dashed line 62, having a radius of approximately 0.001 inch and recessed to a depth of approximately 0.00075 inch, also running longitudinally therethrough but at a right angle to the first groove 60. The first groove 60 is further disposed so that its longitudinal axis is at a right angle to the axis of the ultrasonic scrub, represented in FIG. 4 as directional line 64. The second groove 62, having its longitudinal axis at a right angle to the first groove 60, will therefore have its longitudinal axis running parallel to the axis 64 of ultrasonic scrubbing. The second groove is illustrated more clearly in FIG. 5, wherein the bonding tool tip 42 has been rotated 90°. The relationship between the first groove 60 and second groove 62 is further illustrated in FIG. 6.

During the bonding process, the first groove 60 operates to facilitate a gripping onto the polyimide substrate 46 by the bonding tool tip surface 56, thereby allowing a more effective transfer of ultrasonic energy through the polyimide substrate 46. The second groove 62 further operates to limit the deformation of the substrate 46 and the conductor 52 in the area defined by the bonding tool tip surface 56, and is larger than the first groove 60, thus reducing the chance of a break in the conductor 52 after the attachment bond is completed.

Those skilled in the art can now appreciate from the foregoing description that the broad teachings of the present inventions can be implemented in a variety of forms. Therefore, while these inventions have been described in connection with particular examples thereof, the true scope of the inventions should not be so limited since other modifications will become apparent to the skilled practitioner upon a study of the drawings, specification and following claims.

What is claimed is:

1. A method for bonding a flexible cable to an electrical component, the component having a connection point, the method comprising
   a) providing a flexible cable having a polyimide film substrate, the substrate having an upper and a lower side, the lower side further having a layer of material affixed thereto and a plurality of conductors deposited onto the material;
   b) placing the cable over the component so that the end of a conductor lies on a connection point;
   c) pressing the upper side of the substrate over said end of a conductor with an ultrasonic bonding tool with a pressure that compresses the polyimide film substrate beyond its elastic limit;
   d) applying ultrasonic energy to the tool and through the substrate while applying downward pressure for a sufficient period of time to bond the conductor to the connection point; and
   e) ceasing pressing the upper surface of the substrate and the application of ultrasonic energy to the bonding tool.

2. The method of claim 1 wherein the substrate is a polyimide film having a thickness between approximately 0.0003 to 0.020 inch.

3. The method of claim 2 wherein the substrate is a polyimide film having a thickness between approximately 0.0003 and 0.003 inch.

4. The method of claim 1 wherein the material is metal and selected from the group comprising (a) titanium; (b) tungsten; and (c) molybdenum and chromium.

5. The method of claim 1 wherein the material is titanium having a thickness between approximately 400 and 2,000 angstroms.

6. The method of claim 1 wherein the bonding tool comprises:
   a) a conically shaped tip, the tip further having a flat surface;
   b) a first semi-circular groove in the surface, the groove running across the entire surface of the tip and being operable to facilitate gripping onto the substrate by the tip when the tip is pressing against the upper side of the substrate; and
   c) a second semi-circular groove in the surface, the groove running across the entire surface of the tip and further being at a right angle to the first groove, whereby the second groove operates to limit the deformation of the substrate when the tip is pressing against the upper side of the substrate.

7. The method of claim 1 wherein the downward pressure applied by the bonding tool is in the range of approximately 15 grams–250 grams.

8. The method of claim 1 wherein the downward pressure is applied for a time In the range of approximately 20 milliseconds–2 seconds.

9. A method for bonding a flexible, thin, electrical cable to a circuit connection comprising:
   a) providing a flexible electrical cable having a polyimide film substrate, the substrate further having an upper and lower surface, a layer of adhesive facilitating material deposited onto the lower surface of the polyimide and at least one gold conductor trace deposited onto the adhesive facilitating material;
   b) placing the cable such that the lower surface of an end of the cable is in contact with the circuit connection where a gold conductor trace on said material is deposited;
   c) placing a tip of an ultrasonic bonding tool in contact with the upper surface of the polyimide such that pressure on the bonding tool exerts a force on the gold conductor trace in contact with the circuit connection;
   d) pressing the tip of the bonding tool with a force of between approximately 15 grams and 250 grams and compressing the polyimide beyond its elastic limit for a period of between approximately 20 milliseconds and two seconds;
   e) while applying the force, further applying an ultrasonic scrubbing force to the tip of the bonding tool, said scrubbing force at the rate of between approximately 50,000 KHZ and 100,000 KHZ, to ultrasonically scrub the tip of the bonding tool, whereby ultrasonic energy is transmitted through the polyimide to produce a metallic bond between the gold conductor trace and the circuit connection; and
   f) ceasing the downward force and the ultrasonic energy applied to the bonding tool.

10. The method of claim 9 wherein the adhesive facilitating material is titanium deposited onto the substrate with a thickness of approximately 400 to 2,000 angstroms.

* * * * *